United States Patent
Engel et al.

(10) Patent No.: US 10,069,028 B2
(45) Date of Patent: Sep. 4, 2018

(54) MULTI-WAVELENGTH DETECTOR ARRAY INCORPORATING TWO DIMENSIONAL AND ONE DIMENSIONAL MATERIALS

(71) Applicant: INTERNATIONAL BUSINESS MACHINES CORPORATION, Armonk, NY (US)

(72) Inventors: Michael Engel, Ossining, NY (US); Mathias B. Steiner, Rio de Janerio (BR)

(73) Assignee: INTERNATIONAL BUSINESS MACHINES CORPORATION, Armomk, NY (US)

( * ) Notice: Subject to any disclaimer, the term of this patent is extended or adjusted under 35 U.S.C. 154(b) by 8 days.

(21) Appl. No.: 15/358,783

(22) Filed: Nov. 22, 2016

(65) Prior Publication Data
US 2017/0309769 A1    Oct. 26, 2017

Related U.S. Application Data

(62) Division of application No. 15/137,252, filed on Apr. 25, 2016.

(51) Int. Cl.
| | |
|---|---|
| *H01L 31/10* | (2006.01) |
| *H01L 31/109* | (2006.01) |
| *H01L 31/0232* | (2014.01) |
| *H01L 31/0384* | (2006.01) |
| *H01L 31/18* | (2006.01) |

(52) U.S. Cl.
CPC ........ *H01L 31/109* (2013.01); *H01L 31/0232* (2013.01); *H01L 31/02327* (2013.01); *H01L 31/0384* (2013.01); *H01L 31/03845* (2013.01); *H01L 31/18* (2013.01)

(58) Field of Classification Search
None
See application file for complete search history.

(56) References Cited

U.S. PATENT DOCUMENTS

| | | |
|---|---|---|
| 5,453,611 A | 9/1995 | Oozu et al. |
| 5,861,626 A | 1/1999 | Chandra et al. |
| | (Continued) | |

FOREIGN PATENT DOCUMENTS

| | | |
|---|---|---|
| CN | 203607423 U | 5/2014 |
| CN | 103398989 B | 5/2015 |
| | (Continued) | |

OTHER PUBLICATIONS

List of IBM Patents or Patent Applications Treated as Related dated Nov. 22, 2016, 2 pages.

*Primary Examiner* — Julio J Maldonado
*Assistant Examiner* — Valerie N Newton
(74) *Attorney, Agent, or Firm* — Tutunjian & Bitetto, P.C.; Vazken Alexanian

(57) ABSTRACT

A method of forming a wavelength detector that includes forming a first transparent material layer having a uniform thickness on a first mirror structure, and forming an active element layer including a plurality of nanomaterial sections and electrodes in an alternating sequence atop the first transparent material layer. A second transparent material layer is formed having a plurality of different thickness portions atop the active element layer, wherein each thickness portion correlates to at least one of the plurality of nanomaterials. A second mirror structure is formed on the second transparent material layer.

14 Claims, 13 Drawing Sheets

(56) References Cited

U.S. PATENT DOCUMENTS

| | | |
|---|---|---|
| 7,329,902 B2 | 2/2008 | Vinciguerra et al. |
| 7,903,338 B1 | 3/2011 | Wach |
| 8,159,667 B2 | 4/2012 | Kukushkin et al. |
| 8,610,989 B2 | 12/2013 | Avouris et al. |
| 8,772,890 B2 | 7/2014 | Kukushkin et al. |
| 8,963,265 B1 | 2/2015 | de Andrade et al. |
| 2010/0200839 A1 | 8/2010 | Okai et al. |
| 2011/0042650 A1 | 2/2011 | Avouris et al. |
| 2011/0108805 A1 | 5/2011 | Okai |
| 2011/0272744 A1 | 11/2011 | Ning et al. |
| 2013/0176554 A1 | 7/2013 | Loncar et al. |
| 2015/0024968 A1 | 1/2015 | Rulison et al. |

FOREIGN PATENT DOCUMENTS

| | | |
|---|---|---|
| WO | 2013126548 A2 | 8/2013 |
| WO | 2014194028 A1 | 12/2014 |

MULTI-WAVELENGTH DETECTOR ARRAY INCORPORATING TWO DIMENSIONAL AND ONE DIMENSIONAL MATERIALS

BACKGROUND

Technical Field

The present disclosure relates to broadband wavelength detectors, and methods of forming broadband wavelength detectors.

Description of the Related Art

Wavelength measurement devices that are used to detect, monitor and analyze optical signals in a variety of applications. There are growing demands for wavelength and polarization measurement devices, in particular miniaturized detectors, in telecommunications, spectroscopic, and analytical chemistry industries, and biology as stand alone devices or as part of measurement systems for accurate and high sensitivity measurements of these properties is essential.

SUMMARY

In one aspect, a wavelength detector is provided including an active element that is composed of one dimensional or two dimensional nanomaterials. In some embodiments, the wavelength detector includes a first mirror structure, a first transparent material layer having a uniform thickness, and an active element including a plurality of nanomaterials and electrodes in an alternating sequence. The wavelength detector further comprises a second transparent material layer having a plurality of different thickness portions, wherein each thickness portion correlates to at least one of the plurality of nanomaterials. A second mirror structure is present atop the second transparent material layer.

In another embodiment, a wavelength detector is provided including an active element that is composed of one dimensional or two dimensional nanomaterials and a bandpass filter. In some embodiments, the wavelength detector includes a first mirror structure, a first transparent material layer having a uniform thickness, and an active element including a plurality of nanomaterials and electrodes in an alternating sequence. The wavelength detector further comprises a second transparent material layer having a plurality of different thickness portions, wherein each thickness portion correlates to at least one of the plurality of nanomaterials. A second mirror structure is present atop the second transparent material layer. A bandpass filter may be present atop the second mirror structure.

In another aspect of the present disclosure, a method of forming a wavelength detector is provided. In one embodiment, the method of forming the wavelength detector includes forming a first transparent material layer having a uniform thickness on a first mirror structure; and forming an active element layer including a plurality of nanomaterials and electrodes in an alternating sequence atop the first transparent material layer. In a following step, a second transparent material layer having a plurality of different thickness portions is formed atop the active element layer, wherein each thickness portion correlates to at least one of the plurality of nanomaterials. A second mirror structure is formed atop the second transparent material layer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1A:
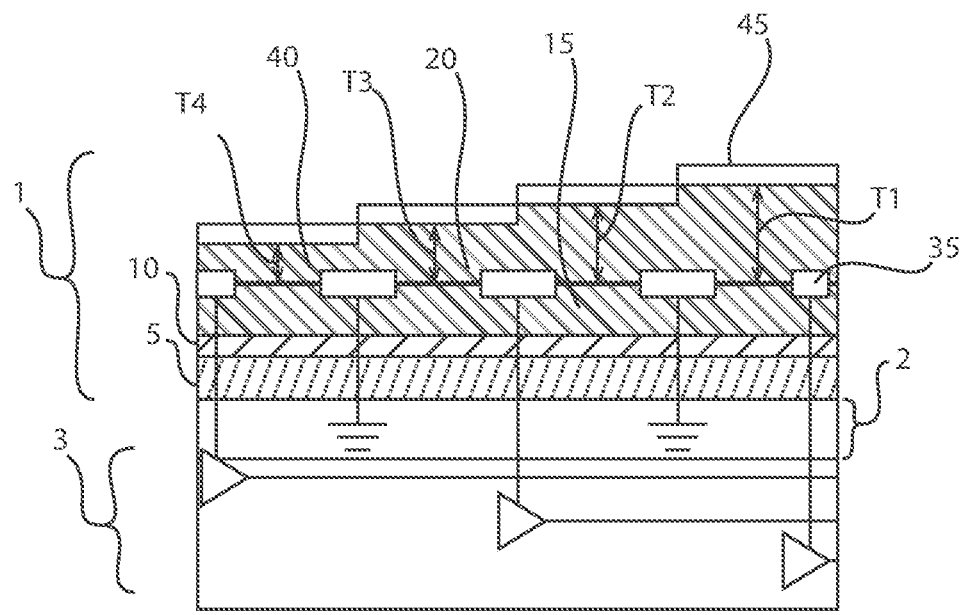
FIG. 1A is a side cross-sectional view of a monolithic wavelength detector, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a multi-wavelength detector array incorporating two dimensional and one dimensional nanoscale materials. It has been determined that there are no known solution for a miniaturized spectrometer/detector combination that would allow for spectroscopy on a lab-on-chip size level. Typical solutions used for spectroscopy typically have a size in the range of 0.1 meter (m) to 1 meter (m). In some embodiments, the methods and structures that are disclosed herein overcome these issues with a novel manufacturing process that incorporates a photosensitive 2D or array of 1D nanometer scale materials, such as graphene, arrays of carbon nanotubes, transition metal dichalconides, or black phosphorus that transduce an optical into an electrical signal in a photodetector type device; and allows for optical spectroscopy by having an array such devices integrated into a cavity structure. The wavelength selective response of each device is determined by the surrounding cavity. This way, light impinging on the detector array can be spectrally analyzed. Hence, the spectral range and resolution can tuned by design of the surrounding cavity. Such a detector array can be highly integrated either monolithically or 3D stacked with a footprint on the order of 1 cm.

In some embodiments, the methods and structures combine standard semiconductor processing steps, i.e. lithography, dielectric and metal thin film deposition process step, and an etch process step, in order to integrate nanometer scale materials into a photodetector array that is embedded in resonant cavity structures. In some embodiments, the specific optical properties of the nanometer scale materials in combination with an appropriately designed cavity structure allow for chip level spectroscopy. In some embodiments, the methods and structures disclosed herein provide increased scaling of wavelength detectors not achieved by prior methods. Further, the methods and structures disclosed herein provide a wavelength detector having a high detector sensitivity given by the optical properties of the nanometer scale materials used in the wavelength detectors of the present disclosure, as well as a high degree of freedom regarding spectral range, and resolution of the detector array which is largely determined by the resonant cavity structure. The methods and structures of the present disclosure are now described with greater detail referring to FIGS. 1-14.

Figure 1B:
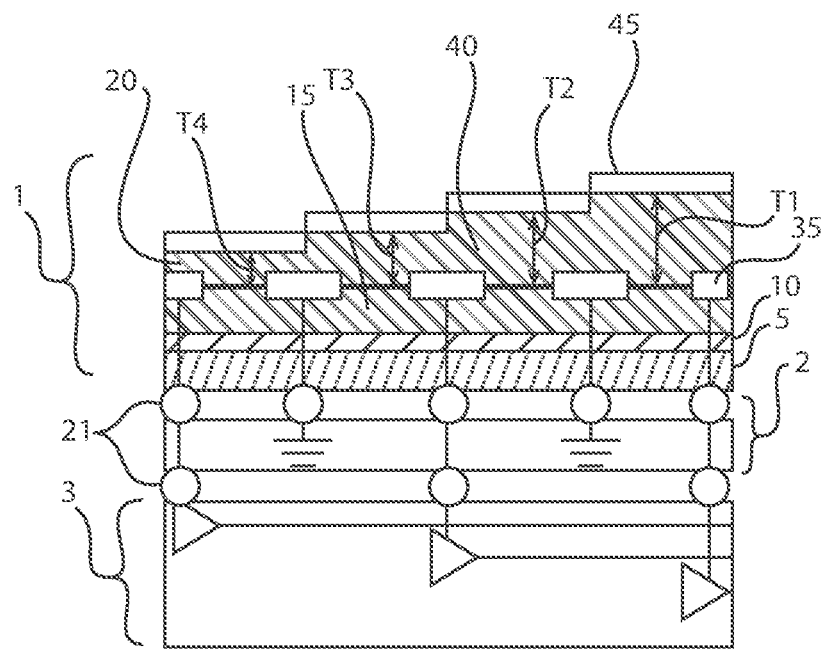
FIG. 1B is a side cross-sectional view of a wavelength detector integrated with a chip substrate in a 3D integration scheme, in accordance with one embodiment of the present disclosure.

FIGS. 1A and 1B illustrates how in some embodiments a complete detector array can be envisioned as three independent physical layers that can be either integrated monolithically, as depicted in FIG. 1A, or combined by some form of wafer bonding/3D stacking, as depicted in FIG. 1B. The three layers may include a first layer 1 including active devices with our without cavity structures, a second layer including wiring and a third layer 3 including read out and amplification structures. In each of the detector arrays depicted in FIGS. 1A and 1B, the active devices include a one dimension or two dimensional nanomaterial 20 (also referred to as nanomaterial sections 20). One-dimensional nanomaterials are nanowires (nanorod) and nanotubular materials with fiber (rod, tube) lengths from 100 nm to tens of microns. Two-dimensional nanomaterials are films (coatings) with nanometer thickness. Structural elements in 1D and 2D nanomaterials can be distributed in a liquid or solid macroscopic matrix or be applied on a substrate. The nanomaterial sections 20 depicted in the structures illustrated in FIGS. 1A and 1B may be selected from the group consisting of graphene, transition metal dichalcogenides, carbon fullerenes, carbon nanotubes, black phosphorus or a combination thereof.

In some embodiments, the first layer 1 including the active devices for the wavelength detectors depicting in FIGS. 1A and 1B may each include a first mirror structure 10, a first transparent material layer 15 having a uniform thickness, and an active element layer including a plurality of nanomaterial sections 20 and electrodes 35 in an alternating sequence. The wavelength detector further comprises a second transparent material layer 40 having a plurality of different thickness portions, wherein each thickness portion correlates to at least one of the plurality of nanomaterial sections 20. A second mirror structure 45 is present atop the second transparent material layer 40.

Referring to FIGS. 1A and 1B, the active element layer includes a plurality of nanomaterial sections 20 and electrodes 35 in an alternating sequence. As described above, the nanomaterial sections 20 may be composed of at least one of graphene, transition metal dichalcogenides, carbon nanotubes, black phosphorus or a combination thereof. The electrodes 35 are present on opposing sides of the nanomaterial sections 20, as part of the alternating sequence of nanomaterial sections 20 and electrodes 35, in order to measure the current and/or resistance across the nanomaterial sections 20, e.g., in response to the application of light. The electrodes 35 may be present between adjacent portions of nanomaterial sections 20 in the plurality of nanomaterial sections, and in direct contact, i.e., electrical contact with the nanomaterial sections. The electrodes 35 may be composed of a metal selected from the group consisting of aluminum, copper, tungsten, silver, gold, titanium and combinations thereof. The thickness of the electrodes 35 may be the same as the thickness of the nanomaterial sections 20 of the active element layer, or the thickness of the electrodes 35 may be greater than the thickness of the nanomaterial sections 20. Referring to FIGS. 1A and 1B in some embodiments, at least some of the electrodes 35 may be connected to wiring in the wiring layer 2, i.e., second layer 2, and in some embodiments, at least some of the electrodes 35 may be connected to wiring in the read out and amplification layer 3, i.e., third layer 3.

The first mirror structure 10 and the second mirror structure 45 may each be composed of a metal selected from the group consisting of gold, silver, aluminum and combinations thereof. The first transparent material layer 15 and the second transparent material layer 20 may each be composed of a light transmissive material selected from the group consisting of aluminum oxide ($Al_2O_3$), silicon oxide ($SiO_2$), silicon (Si), silicon nitride ($Si_3N_4$) and combinations thereof. As noted above, the first transparent material layer 15 may have a uniform thickness. This means that for the entire width of the device, i.e., the entire width of the first and second mirror structures 10, 45, the thickness of the first transparent material layer 15 is substantially the same. For example, the first transparent material layer 15 may have a thickness ranging from 10 nm to 1000 nm.

The plurality of different thickness portions include a plurality of reducing thicknesses T4, T3, T2, T1 with successive steps, each step of reducing thickness overlying one of the plurality of nanomaterials 20. For example, the reducing thickness from the first step having the greatest thickness T1 to the fourth step having the least thickness T4 can provide that each successive step of reducing thickness T1, T2, T3, T4 produces dimensions from the first mirror structure 10 to the second mirror structure 45 with one of the plurality of nanomaterials 20 present therebetween to provide a wavelength to be measured by change in resistance measured across electrodes 35 of the alternating sequence of electrodes 35 that are positioned on opposing sides of said one of said plurality of nanomaterial portions 20.

In the monolithic structure depicted in FIG. 1A, the first layer 1 is in direct contact with a first surface of the second layer 2, and an opposing second surface of the second layer is in direct contact with the third layer 3. The first layer 1 may be include a supporting substrate 5 that has a first surface in contact with the first mirror 10, and a second surface opposing the first surface that is in contact with the second layer 2, i.e., wiring layer 2. The supporting substrate 5 may be composed of any semiconductor and/or dielectric material, e.g., the supporting substrate 5 may be composed of silicon or glass. In the embodiment that is depicted in FIG. 1A, the supporting substrate 5 is in direct contact with the second layer 2, i.e., wiring layer 2, wherein vias extend from at least some of the electrodes 35 in from the first layer 1 to wiring in the wiring layer 2. The wiring layer 2 may be present in direct contact with the third layer 3, in which vias may extend from at least some of the electrodes 35 through the second layer 2 to the amplification and read out wiring in the third layer 3. Referring to FIG. 1B, the first layer 1, second layer 2 and the third layer 3 may be bonded together in a 3D integration of dedicated chips. For example, the first layer 1, second layer 2 and the third layer 3 may be bonded using solder bump technology. In the embodiment depicted in FIG. 3B, the solder bumps 21 can provide for connection from the vias to the electrodes 35 contacting the nanomaterial portions 20 to the wiring in the wiring level, i.e., second layer 2, and/or to the wiring for amplification and read out in the third layer 3. The structures depicted in FIGS. 1A and 1B are now described with more detail by describing some embodiments for forming a wavelength detector with reference to FIGS. 2-14.

Figure 2:
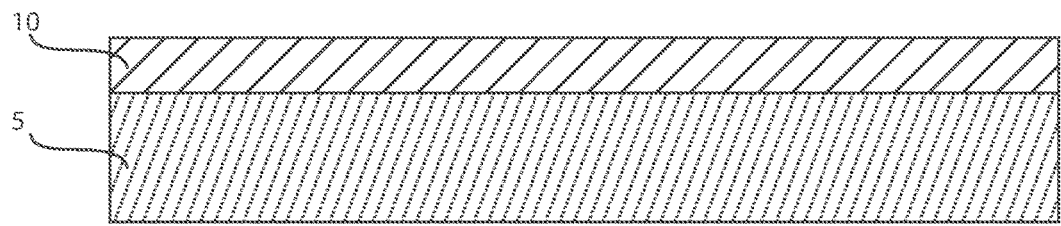
FIG. 2 is a side cross-sectional view depicting one embodiment of forming a cavity mirror on a carrier substrate, in accordance with the present disclosure.

FIG. 2 depicts one embodiment of forming a cavity mirror 10 on a carrier substrate 5, also referred to as supporting substrate 5. The cavity mirror 10 is hereafter referred to as the first mirror 10. As noted above, the first mirror 10 may be composed of a light reflective material, such as a metal, e.g., gold, silver, aluminum or a combination thereof. The supporting substrate 5 can an insulating material, such as silicon, glass, quartz, plastics. To provide the first mirror 10, the supporting substrate 5 can be coated with a highly reflective layer that serves as the first mirror 10 in this cavity structure. For example, the layers can be deposited via processes, such as atomic layer deposition (ALD), thermal/e-beam evaporation, or chemical vapor deposition (CVD). In other embodiments, a Bragg reflector may be formed on the supporting substrate 5, i.e. repeating alternating dielectric layers that have a contrast in their permittivity.

Figure 3:
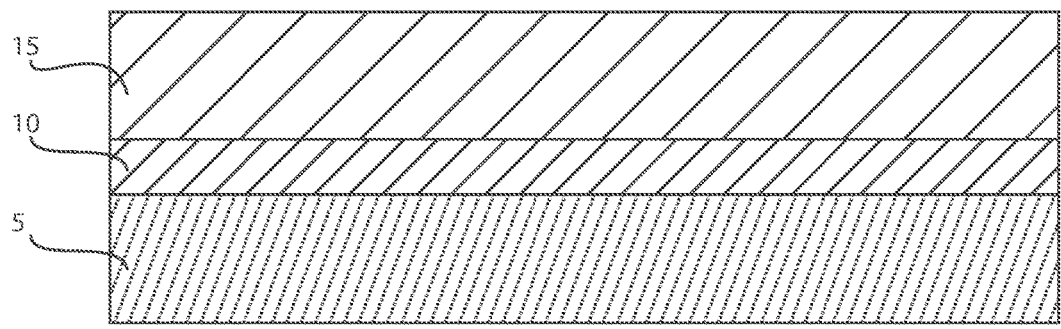
FIG. 3 is a side cross-sectional view depicting one embodiment of forming a first transparent layer on the cavity mirror that is depicted in FIG. 2.

FIG. 3 depicts one embodiment of forming a first transparent layer 15 on the cavity mirror, i.e., first mirror 10 that is depicted in FIG. 2. The first transparent layer 15 may acts as a first intra cavity medium or spacer, and can be composed of a dielectric material, such as silicon oxide, silicon nitride, aluminum oxide or a combination thereof. The first transparent layer 15 typically has a uniform thickness. For example, the thickness, i.e., height, of the first transparent layer 15 is typically the same across its entire width and depth, e.g., the thickness does not deviate more than +/−5% across its width and/or depth. In some examples, the thickness of the first transparent layer 15 may range from 10 nm to 1000 nm. The first transparent layer 15 can be deposited by chemical vapor deposition, such as plasma enhanced chemical vapor deposition (PECVD). Other deposition processes for forming the first transparent layer 15 include atomic layer deposition and/or thermal/e-beam evaporation. In some embodiments, the first transparent layer 15 can be planarized using grinding, or chemical mechanical planarization (CMP) to increase the uniformity of the layer.

Figure 4A:
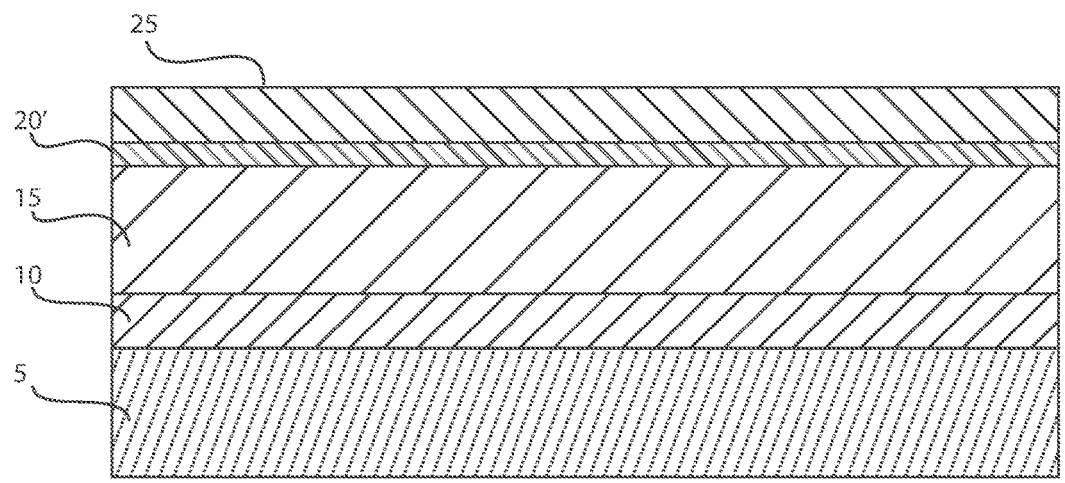
FIG. 4A is a side cross-sectional view depicting positioning a layer of a one dimension or two dimensional nanomaterial on the first transparent layer that is depicted in FIG. 3, and forming a first mask atop the layer of one dimension or two dimensional nanomaterial, in accordance with one embodiment of the present disclosure.
Figure 4B:
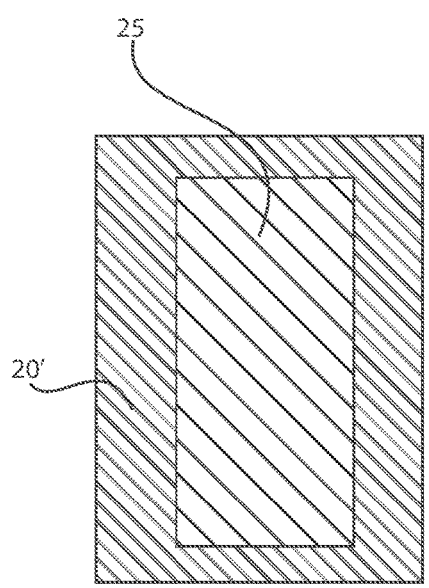
FIG. 4B is a top down view of the structure depicted in FIG. 4A.

FIGS. 4A and 4B depict one embodiment of positioning a layer of a one dimension or two dimensional nanomaterial 20' on the first transparent layer 15 that is depicted in FIG. 3, and forming a first mask 25 atop the layer of one dimension or two dimensional nanomaterial 20'. The layer of one dimensional or two dimensional nanomaterial 20' may be graphene, transition metal dichalcogenides, carbon fullerenes, carbon nanotubes, black phosphorus or a combination thereof. The layer of one dimension or two dimensional nanomaterial 20' can be transferred onto the first transparent layer 15, i.e., first intra cavity medium, or directly synthesize on the first transparent layer 16 by chemical vapor deposition (CVD) or van der Waals epitaxy. Chemical vapor deposition (CVD) is a deposition process in which a deposited species is formed as a result of chemical reaction between gaseous reactants at greater than room temperature (25° C. to 900° C.), wherein solid product of the reaction is deposited on the surface on which a film, coating, or layer of the solid product is to be formed. Variations of CVD processes suitable for forming the layer of one dimension or two dimensional nanomaterial 20' include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. CVD may be one method that is suitable for forming a layer of one dimension or two dimensional nanomaterial 20' comprised of carbon fullerene or carbon nanotube structures. Van der Waals epitaxy is a form of molecular beam epitaxial (MBE) growth where the materials constituents bond initially by just van der Waals forces. Surfaces of quasi-two-dimensional layered crystals (2D materials) such as the transition metal dichalcogenides (TM-DC's) display no dangling bonds and only weak van der Waals like forces act across the 2D/2D heterojunctions of layered materials. Due to the weak interaction, an epilayer grows from the beginning with its own lattice constant forming an interface with only a small amount of defects. Heteroepitaxial growth of the layered crystals by MBE may be referred to as Van Der Waals Epitaxy (VDWE). The thickness of the one dimension or two dimensional nanomaterial 20' may range from 0.2 nm to 10 nm.

Referring to FIGS. 4A and 4B, the method may continue with the application of a first mask 25. Generally, the first mask 25 can be a soft mask, like optical or electron-beam lithography resist (e.g. PMMA, HSQ, or S1818) or a hard mask, like an oxide, nitride, or metal deposited by a compatible deposition method.

The first mask 25 may be patterned by a standard lithography (e.g. optical/electron beam lithography, direct laser writing). In one embodiment, forming the first mask 25 may include applying a photoresist layer to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions, as will be discussed with greater detail with reference to FIGS. 5A and 5B.

Figure 5A:
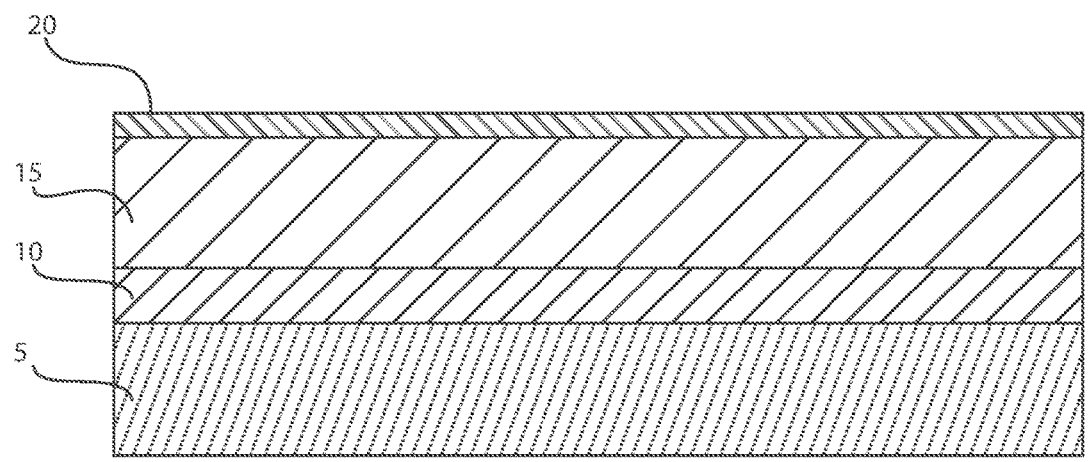
FIG. 5A is a side cross-sectional view depicting patterning the layer of the one dimension or two dimensional nanomaterial on the first transparent layer that is depicted in FIG. 3, and removing first mask, in accordance with one embodiment of the present disclosure.
Figure 5B:
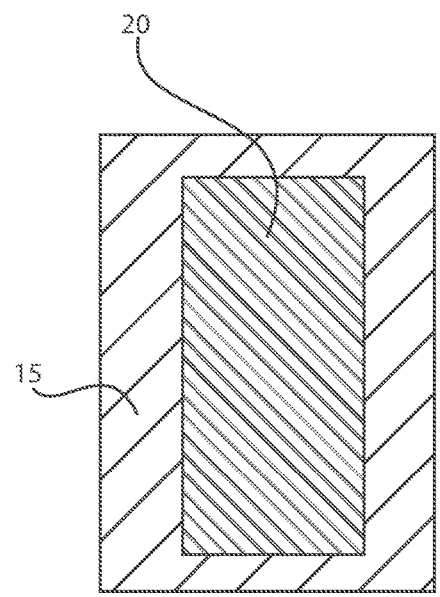
FIG. 5B is a top down view of the structure depicted in FIG. 5A.

FIGS. 5A and 5B depict one embodiment of patterning the layer of the one dimension or two dimensional nanomaterial 20' that is present atop the first transparent layer 15' using the first etch mask 25. For example, the pattern provided by the first etch mask 25 can be transferred into the layer of the one dimension or two dimensional nanomaterial 20' by a suitable dry or wet etching technique. In some embodiments, the etch process may be an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, argon sputtering, plasma etching or laser ablation. The etch process may also be isotropic, i.e., not directional, such as a wet chemical etch. The etch process for patterning the layer of one dimensional or two dimensional nanomaterial 20' may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater. For example, the layer of one dimensional or two dimensional nanomaterial 20' may be etched selectively to the first transparent layer 15 and the first etch mask 25. Following etching of the layer of one dimensional or two dimensional nanomaterial 20', the remaining portion of the layer of one dimensional or two dimensional nanomaterial 20' may be referred to as the plurality of nanomaterial sections 20. Following etching, the first etch mask 25 may be removed. The first etch mask 25 may be removed by selective etch processing or oxygen ashing or chemical stripping. The first mask is employed to define the 2D material layer to be etched.

Figure 6A:
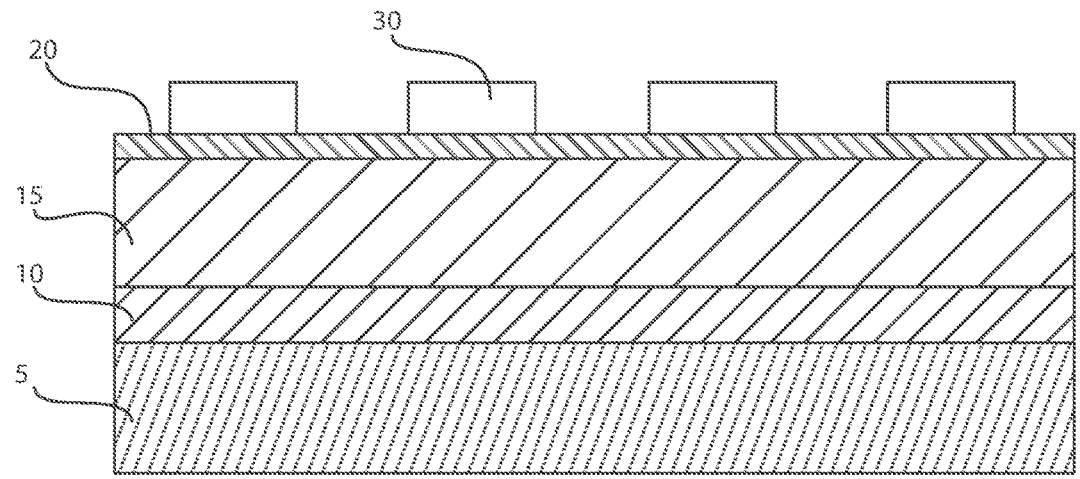
FIG. 6A is a side cross-sectional view depicting forming a second mask atop the structure depicted in FIG. 5A.
Figure 6B:
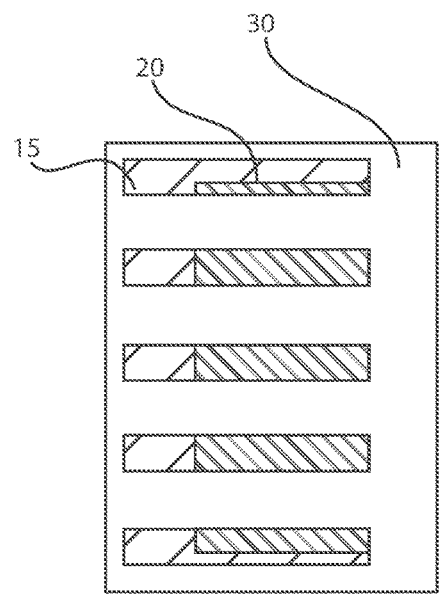
FIG. 6B is a top down view of the structure depicted in FIG. 6A.

FIGS. 6A and 6B depict forming a second mask 30 atop the structure depicted in FIG. 5A. Similar to the first mask 25, the second mask 30 may be a hard mask or a soft mask. Therefore, further details regarding the composition and method of forming the second mask 30 is provided above in the description of the first mask 25. The geometry of the second mask 30, e.g., placement of the openings, is selected for forming the electrodes 35.

Figure 7A:
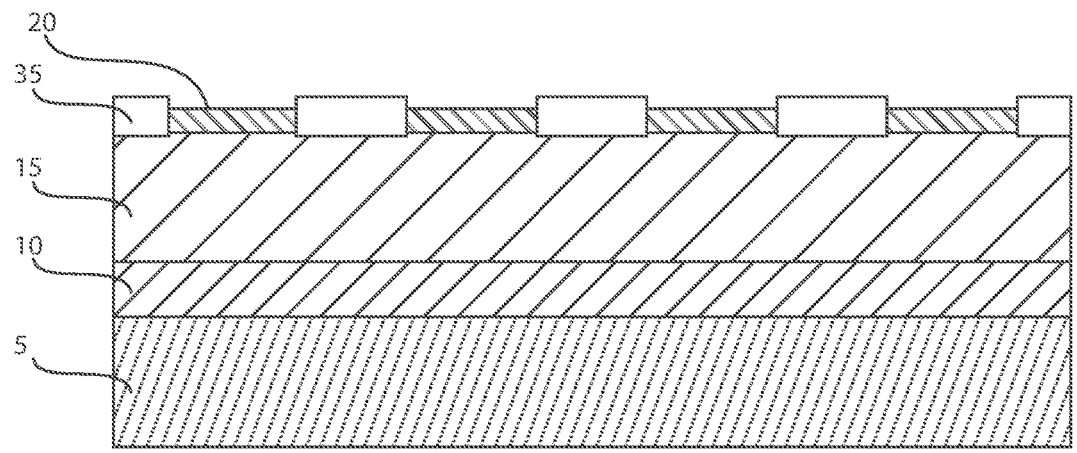
FIG. 7A is a side cross-sectional view depicting forming metal contacts, i.e., electrodes, to the one dimension or two dimensional nanomaterial, in accordance with one embodiment of the present disclosure.
Figure 7B:
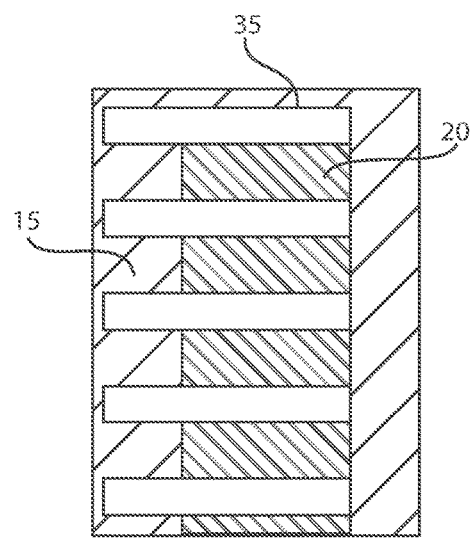
FIG. 7B is a top down view of the structure depicted in FIG. 7A.

In some embodiments, forming the second mask 30 is followed by deposition of a metallic thin film through the mask by a deposition process, such as chemical vapor deposition (CVD) or physical vapor deposition (PVD), as depicted FIGS. 7A and 7B. Examples of PVD that are suitable for forming depositing the metal material for the electrodes 35 may include sputtering, plating, electroplating, electroless plating and combinations thereof. This metal layer will form the source and drain contacts, i.e., electrodes 35, and some examples of suitable metals include W, Ti, Pd, Au, Cr, and combinations thereof. Following deposition of the metal layer for the electrodes 35, the second mask 30 is removed using a lift off process. The portion of the metal layer that remains between the plurality of nanomaterial sections 20 provides the electrodes 35. The portion of the metal layer that is formed over the second mask 30 is removed.

Figure 8:
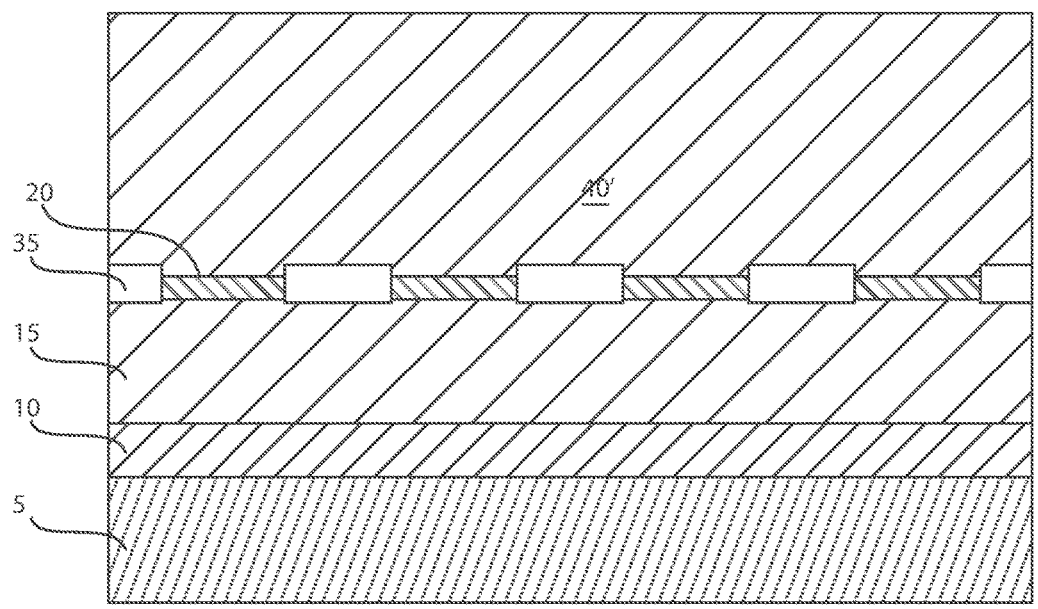
FIG. 8 is a side cross-sectional view depicting forming a buffer layer of a transparent material on the structures depicted in FIGS. 7A and 7B, in which the buffer layer is overlying the metal contacts and the one dimension or two dimensional nanomaterial, in accordance with one embodiment of the present disclosure.

FIG. 8 depicts forming a buffer layer of a transparent material (hereafter referred to as second transparent layer 40') on the structures depicted in FIGS. 7A and 7B, in which the second transparent layer 40' is overlying the metal contacts, i.e., electrodes, and the plurality of nanomaterial sections 20. In some embodiments, the second transparent layer 40' acts as a second intra cavity medium or spacer. The second transparent layer 40' may be composed of a material, such as silicon oxide, silicon nitride, aluminum oxide or combinations thereof. Suitable deposition methods for forming the second transparent layer 40' may include atomic layer deposition, thermal/e-beam evaporation, or chemical vapor deposition, e.g., plasma enhanced chemical vapor deposition (PECVD).

Figure 9:
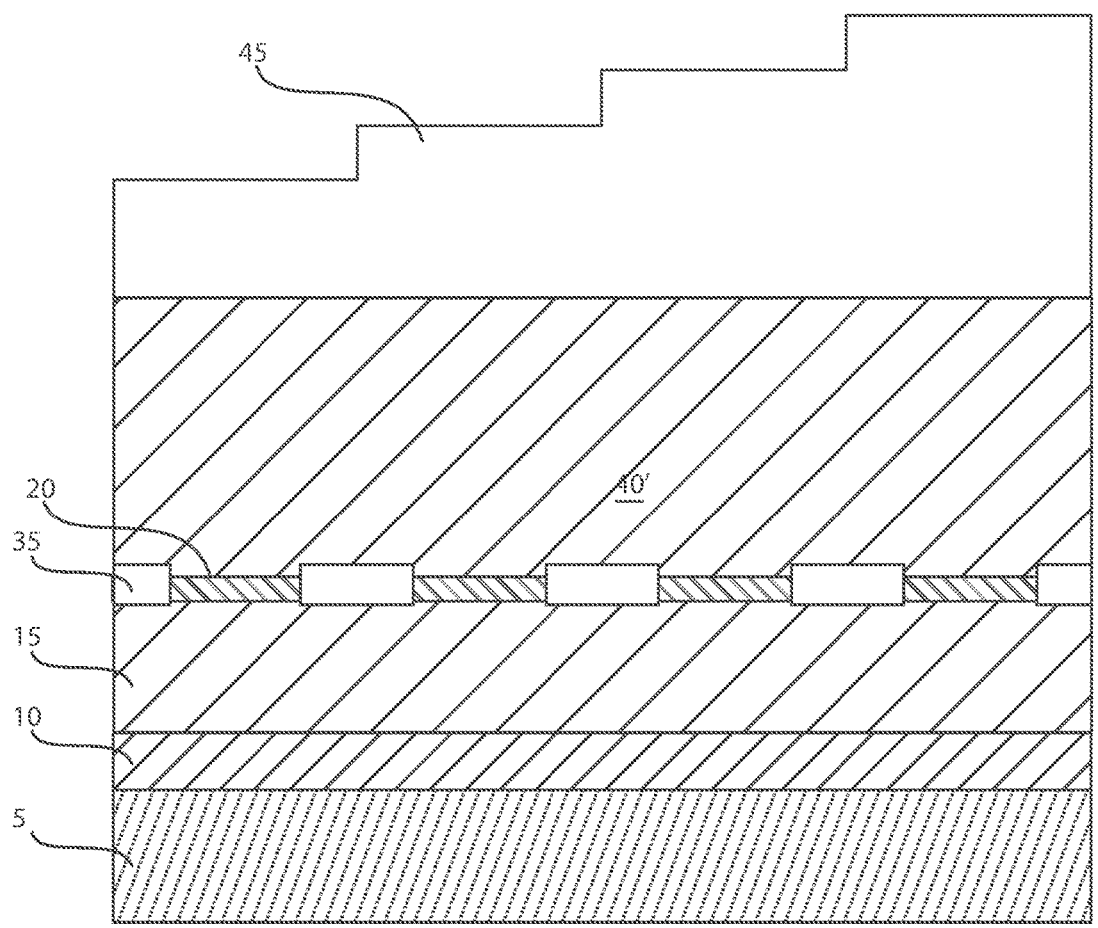
FIG. 9 is a side cross-sectional view depicting forming a third mask atop the structure depicted in FIG. 8.

FIG. 9 depicting one embodiment of forming a third mask 45 atop the structure depicted in FIG. 8. In some embodiments, the third mask 45 can be a soft mask, like optical or electron-beam lithography resist, e.g., poly(methyl methacrylate) (PMMA), hydrogen silsesquioxane (HSQ), or S1818. In one embodiments, the third mask 45 can be a hard mask, such as an oxide, nitride, or metal. In some embodiments, the third mask 45 is patterned by a realization of grey scale lithography. This can be achieved by optical or e-beam lithography or similar method resulting in a location dependent mask thickness with just one lithography step. As depicted in FIG. 9, the patterning of the third mask 45 provides an mask having a stepped upper surface with different thicknesses along its width. The different thicknesses of the third mask 45 correspond to the different thicknesses T1, T2, T3, T4 that are formed in second transparent layer 40, as described in FIG. 10.

Figure 10:
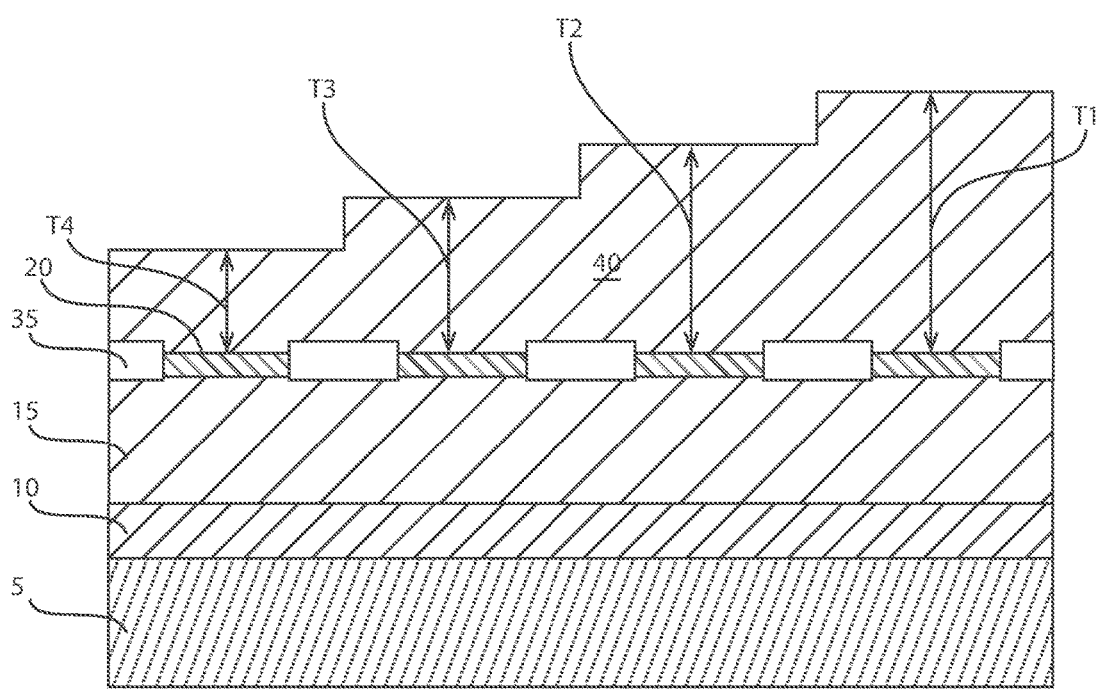
FIG. 10 is a side cross-sectional view depicting patterning the buffer layer to provide a second transparent layer, in accordance with one embodiment of the present disclosure.

FIG. 10 depicts patterning the buffer layer, i.e., second transparent layer 40'. The pattern is transferred in the underlying second transparent layer 40 by means of an anisotropic dry etch technique, e.g. reactive ion etching (RIE). Other anisotropic etch processes that are suitable at this stage of the process flow may include ion beam etching, argon sputtering, plasma etching or laser ablation. The amount of etched material removed from the second transparent layer 40 is dependent on the thickness of the overlaying mask, i.e., overlying third mask 45. Hence, in some embodiments, the etch process will result in location dependent thickness of the second transparent layer 40 as determined by the mask.

As illustrated in FIG. 10, in one embodiment, the second transparent layer 40 may be etched to provide four steps of different thicknesses. For example, a first step of the second transparent layer 40 may have a thickness T1 ranging from 10 nm to 1000 nm. For example, a second step of the second transparent layer 40 may have a thickness T2 ranging from 10 nm to 1000 nm. For example, a third step of the second transparent layer 40 may have a thickness T3 ranging from 10 nm to 1000 nm. For example, a fourth step of the second transparent layer 40 may have a thickness T4 ranging from 10 nm to 1000 nm. Each of the thicknesses T1-T4 may be within the same range, but the actual thickness value for each step is different to provide the different resonant wavelengths.

Figure 11A:
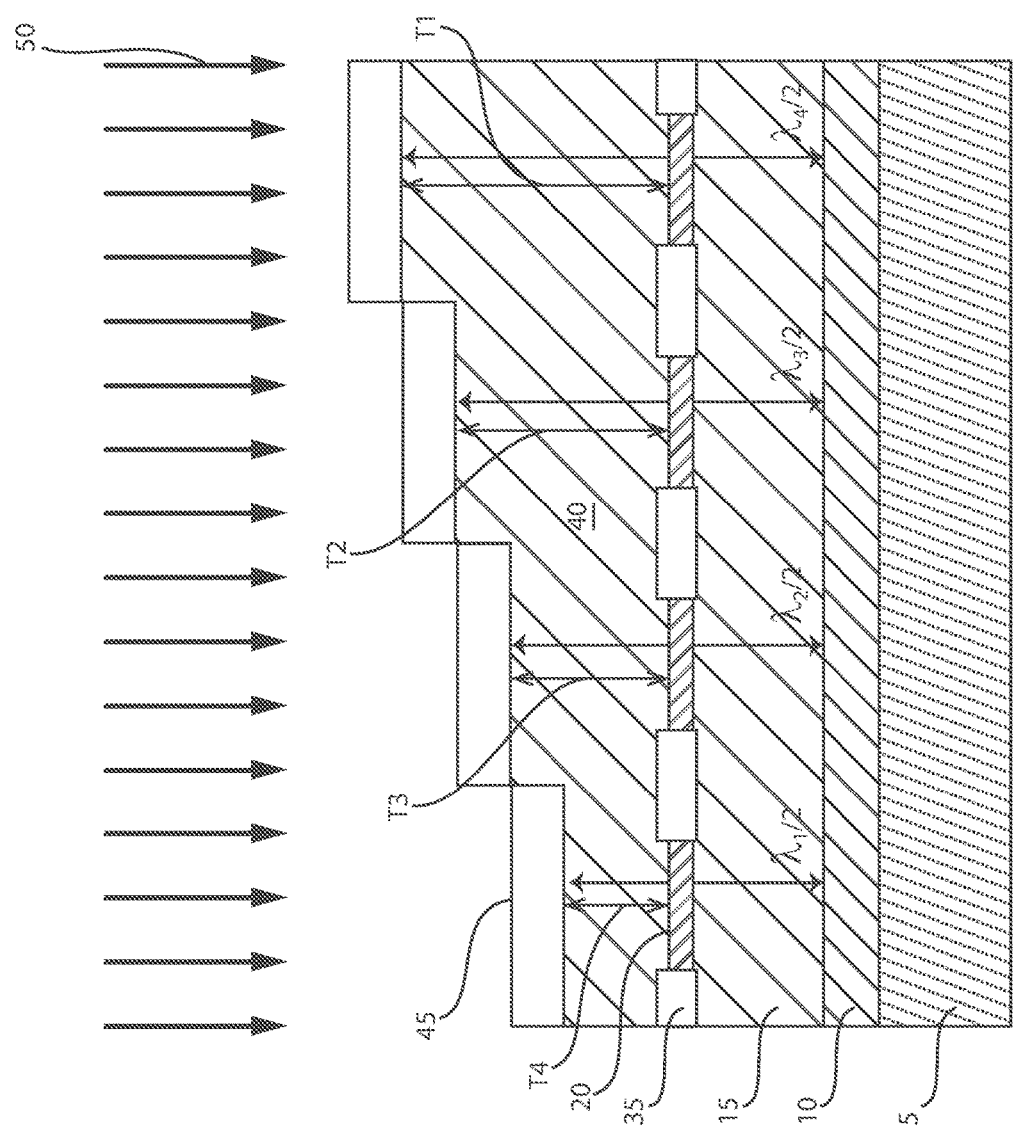
FIG. 11A is a side cross-sectional view depicting forming a cavity mirror atop the structure depicted in FIG. 10, and the application of light to the wavelength detector formed by the steps depicted in FIGS. 2-11, in accordance with one embodiment of the present disclosure.
Figure 11B:
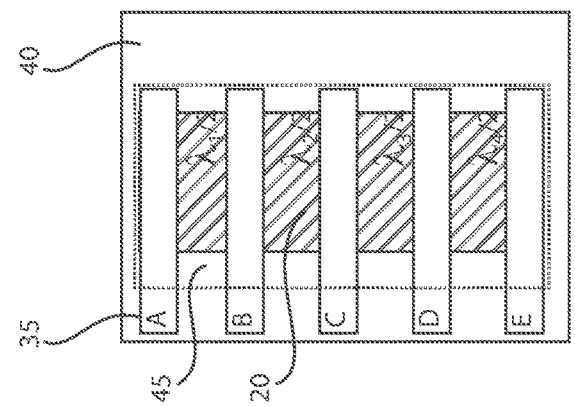
FIG. 11B is a top down view of the structure depicted in FIG. 11A.

FIGS. 11A and 11B depict forming a cavity mirror, e.g., second mirror 45, after patterning the second transparent layer 40. The material layer for the second mirror 45 can be a highly reflective metal. For example, the second mirror 45 may be composed of at least one of gold, silver, aluminum or a combination thereof. The thickness of the second mirror 45 may range from 10 nm to 100 nm. In another example, the second mirror 45 may be a Bragg reflector, which can include repeating alternating dielectric layers that have a contrast in their permittivity. The layers for the second mirror can be formed using a deposition processes such as atomic layer deposition, thermal/e-beam evaporation, or chemical vapor deposition. As depicted in FIG. 11B, the top mirror, i.e., second mirror 45 (second cavity mirror) can be removed in unwanted areas of the device by applying a mask and subsequent etching the second mirror 45.

FIGS. 11A and 11B further depict the application of light 50 to the wavelength detector that is formed by the steps depicted in FIGS. 2-11B. In the embodiments depicted in FIGS. 11A and 11B four pixels for detecting wavelengths is provided. Each pixel includes one nanomaterial section 20 and two electrodes 35. FIGS. 11A and 11B depict one illustration of the working principle of the multi-wavelength detector array provided herein. Each pixel of the wavelength detector formed by a two terminal device incorporating the 2-dimensional material detects only light wavelengths that are resonant with the local cavity structure. The resonance wavelength is determined largely by the separation of the two cavity mirrors, i.e., separation of first mirror 10 from the second mirror 45, as indicated in FIG. 11A. For example, because the second transparent layer 40, i.e., second cavity, has different thicknesses, e.g., four different stepped thicknesses T1, T2, T3, T4, there is a difference in the separation of the first mirror 10 from the second mirror 40 across the width of the detector. For example, the pixel with the greatest separation between mirrors, i.e., first and second mirror 10, 45, is the pixel with the greatest thickness portion T1 of the second transparent layer 40, which detects the greatest wavelength of light λ4/2 that is detected by the wavelength detector. In one example, the wavelength of light λ4/2 detected by this portion of the wavelength detector may range from 200 nm to 2000 nm. For example, the pixel with the second greatest separation between mirrors, i.e., first and second mirror 10, 45, is the pixel with the second greatest thickness portion T2 of the second transparent layer 40, which detects the second greatest wavelength of light λ3/2 that is detected by the wavelength detector. In one example, the wavelength of light λ3/2 detected by this portion of the wavelength detector may range from 200 nm to 2000 nm. For example, the pixel with the second least separation between mirrors, i.e., first and second mirror 10, 45, is the pixel with the second least thickness portion T3 of the second transparent layer 40, which detects the second least wavelength of light λ2/2 that is detected by the wavelength detector. In one example, the wavelength of light λ2/2 detected by this portion of the wavelength detector may range from 200 nm to 2000 nm. For example, the pixel with the least separation between mirrors, i.e., first and second mirror 10, 45, is the pixel with the least thickness portion T4 of the second transparent layer 40, which detects the least wavelength of light λ1/2 that is detected by the wavelength detector. In one example, the wavelength of light λ1/2 detected by this portion of the wavelength detector may range from 200 nm to 2000 nm. It is noted that although each wavelength detected by the pixels having the second transparent layer 40 with different thicknesses T1-T4 may be within the same range, but the actual wavelength value for each pixel is different to provide a multi-wavelength detecting device.

Detection of light using the wavelength detector disclosed herein occurs when a change in resistance is measured across two electrodes 35 to a nanomaterial section 20 of a pixel corresponding to a wavelength λ1/2, λ2/2, λ3/2, λ4/2. Each pixel represents a single photodetector which give a maximum signal depending when illuminated at their peak λ1. Since λ is different for each pixel, the detector can analyze the incoming by wavelength.

It is noted that the above example, e.g., wavelengths and dimensions provided in the example, have been provided for illustrative purposes only, and is not intended to limit the present disclosure, as other examples are equally applicable to the methods and structures disclosed herein. For example, the wavelength detectors that are disclosed herein may have dimensions selected to detect violet light, ultra violet (UV) light, infra red (IR) light and near infra red light.

Figure 12:
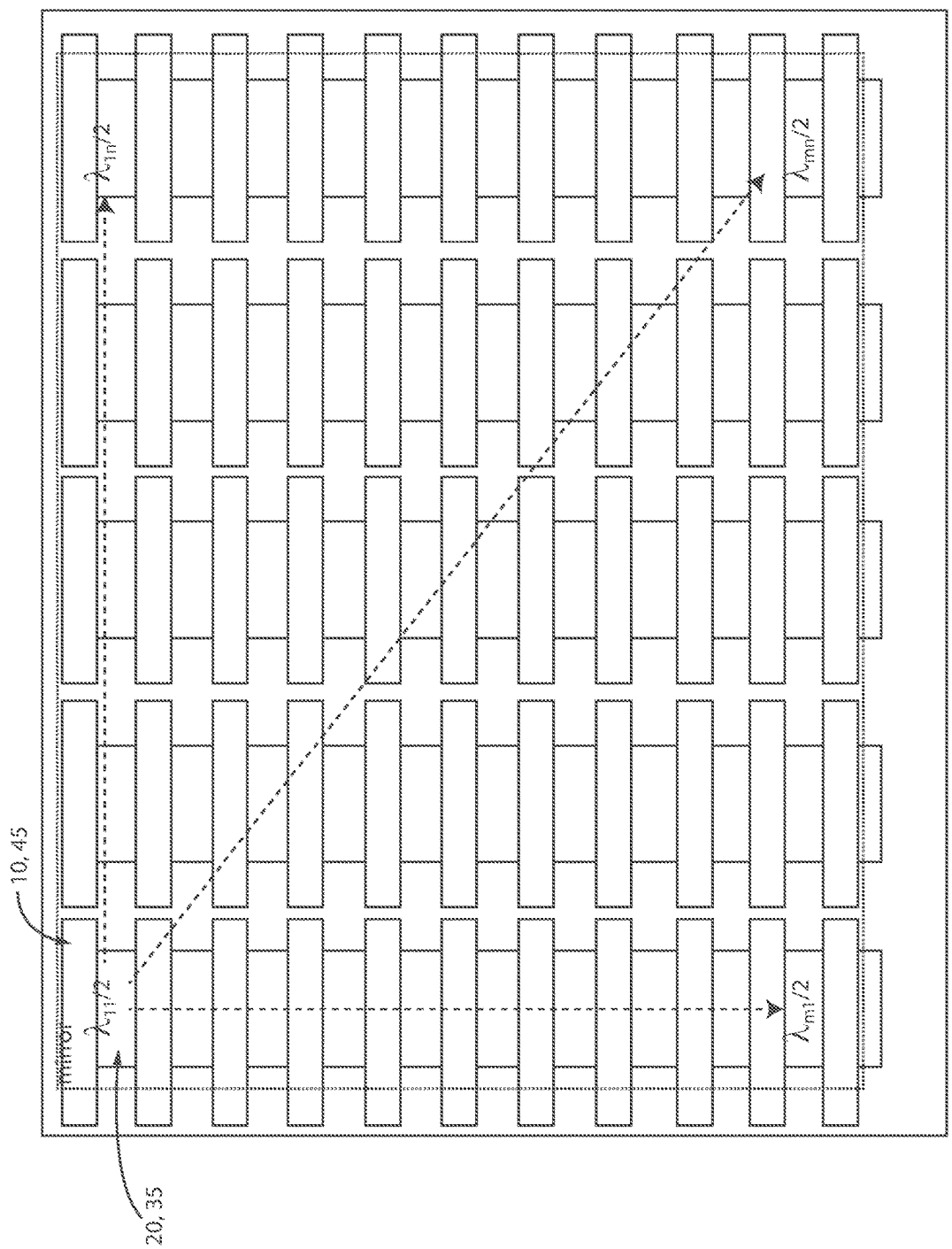
FIG. 12 is a top down view of a two dimensional array of wavelength detectors, in accordance with one embodiment of the present disclosure.

FIG. 12 is a top down view of a two dimensional array of wavelength detectors, in accordance with one embodiment of the present disclosure. FIG. 12 illustrates that this cannot only be a 1-dimensional array but also a 2-dimensional detector array. FIG. 12 illustrates that it is not requited that the "pixels" be in a single line as indicated in up to FIG. 11 but can also be arranged a 2D array of pixels.

Figure 13B:
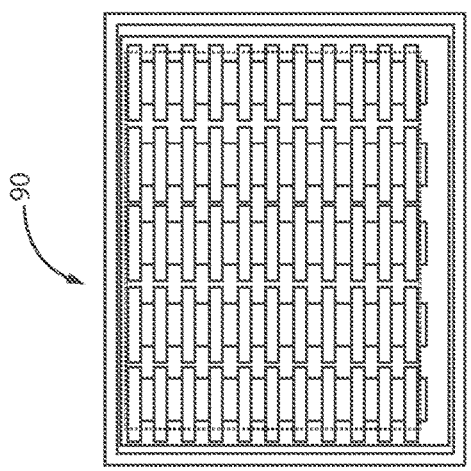
FIG. 13B is a top down view from the hyperspectral image sensor depicted in FIG. 13A that has been magnified to depict an array of wavelength detectors in the hyperspectral image sensor depicted in FIG. 13A.
Figure 13A:
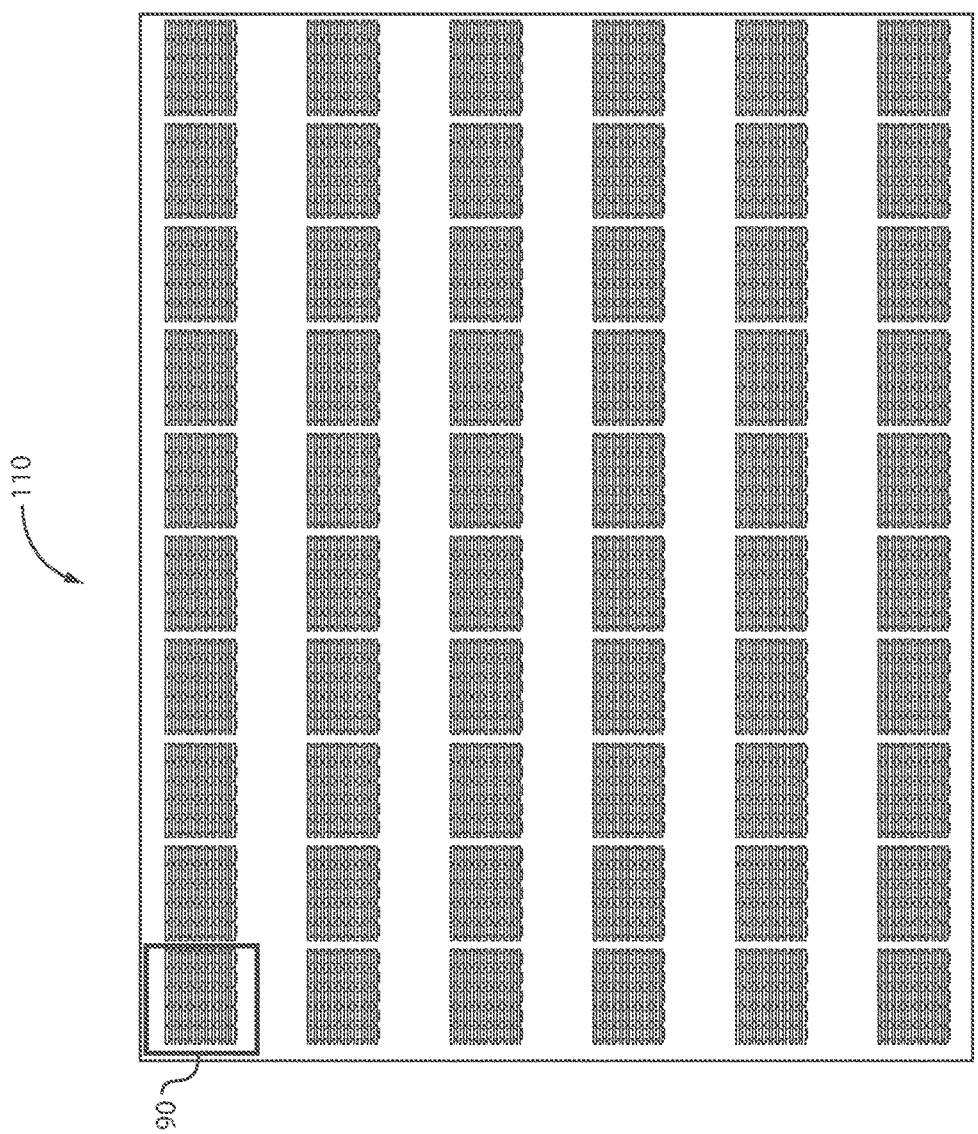
FIG. 13A is a top down view of a hyperspectral image sensor, in accordance with one embodiment of the present disclosure.

FIG. 13A is a top down view of a hyperspectral image sensor, in accordance with one embodiment of the present disclosure. FIG. 13B is a top down view from the hyperspectral image sensor depicted in FIG. 13a that has been magnified to depict an array of wavelength detectors in the hyperspectral image sensor depicted in FIG. 13A. Considering the structure depicted in FIGS. 11A and 11B as a single pixel 90 that provides signal for a range of wavelengths. You can envision a detector array 110 made out of these sub-units of single pixels 90. This would enable what is called hyperspectral imaging, i.e. each pixel of an image contains information about the wavelength composition.

Figure 14:
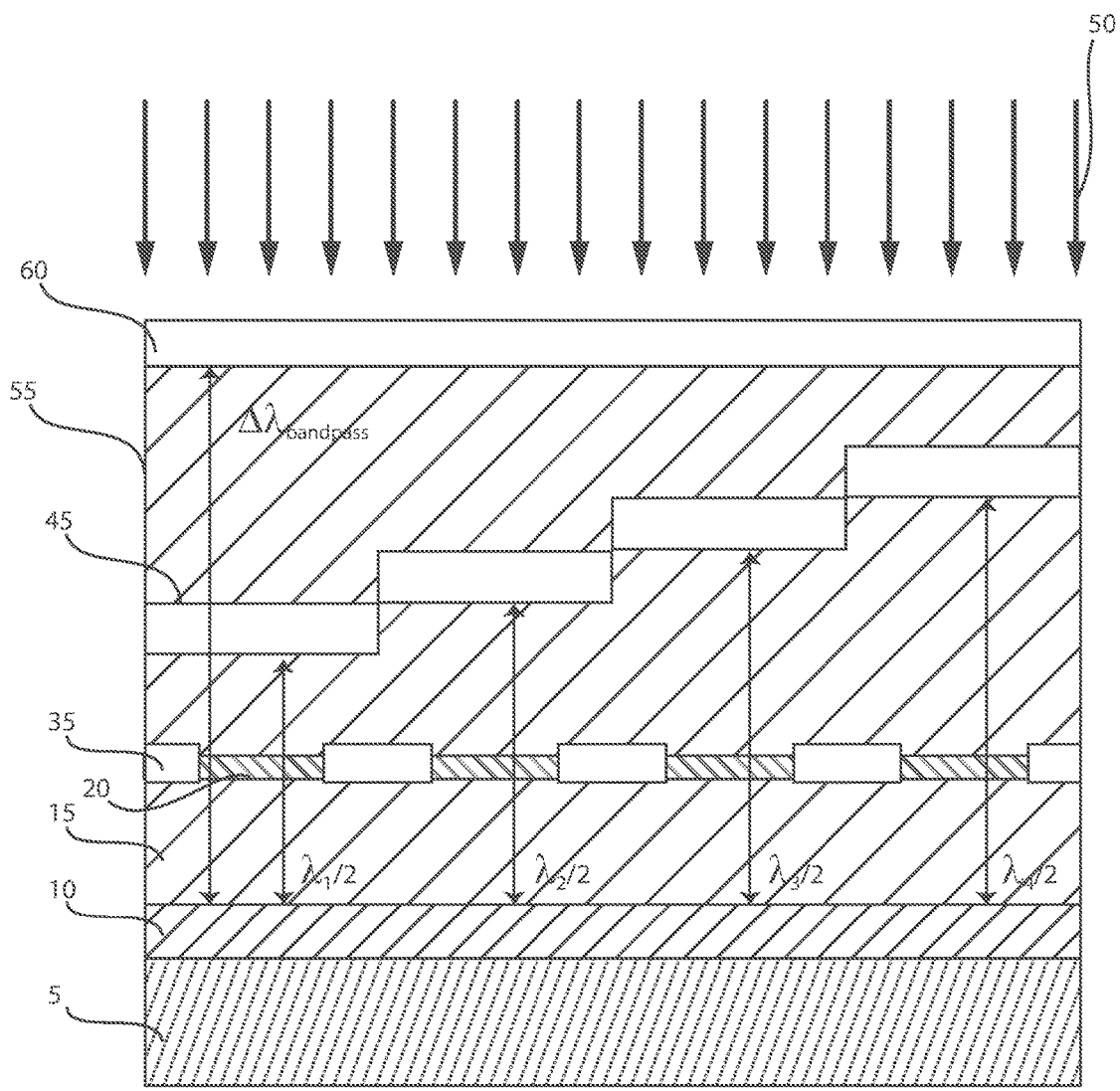
FIG. 14 is a side cross-sectional view of another embodiment of a wavelength detector that includes a bandpass filter, in accordance with the present disclosure.

FIG. 14 depicts one embodiment of a wavelength detector that includes an optical filter, e.g., bandpass filter 55, 60. Optical filters are devices that selectively transmit light of different wavelengths.

Optical filters selectively transmit light in a particular range of wavelengths, that is, colors, while blocking the remainder. They can usually pass long wavelengths only (longpass), short wavelengths only (shortpass), or a band of wavelengths, blocking both longer and shorter wavelengths (bandpass). In some embodiments, a bandpass filters 55, 60 only transmit a certain wavelength band, and block others. In the embodiment that is depicted in FIG. 14, the entire detector can be covered with an additional dielectric 55 and another mirror layer 60 that acts as a bandpass filter to preselect certain wavelength regimes. The filter can be realized by for example a Bragg reflector, i.e. repeating alternating dielectric layers that have a contrast in their permittivity. For example, when two materials are layered together that differ in their index of refraction a filter can be created.

The methods and structures that have been described above with reference to FIGS. 1A-14 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a wavelength detector comprising:
   forming a first transparent material layer having a uniform thickness on a first mirror structure;
   forming an active element layer including a plurality of nanomaterial sections and electrodes in an alternating sequence atop the first transparent material layer, wherein the plurality of nanomaterial sections are composed of nanomaterials selected from the group consisting of graphene, transition metal dichalcogenides, carbon fullerenes, carbon nanotubes, black phosphorus or a combination thereof;
   forming a second transparent material layer having a plurality of different thickness portions atop the active element layer, wherein each thickness portion correlates to at least one of the plurality of nanomaterial sections, wherein the second transparent material layer is composed of a light transmissive material selected from the group consisting of aluminum oxide ($Al_2O_3$), silicon oxide ($SiO_2$), silicon (Si), silicon nitride ($Si_3N_4$) and combinations thereof, wherein the plurality of different thickness portions include a plurality of reducing thicknesses with successive steps, each step of reducing thickness overlying one of the plurality of nanomaterials; and
   forming a second mirror structure on the second transparent material layer.

2. The method of claim 1, wherein forming the plurality of nanomaterial sections comprises:
   forming a layer of nanomaterials using a deposition process selected from the group consisting of chemical vapor deposition (CVD) or van der Walls epitaxial growth; and
   patterning the plurality of nanomaterial sections from the layer of nanomaterials using a photoresist mask and etch process.

3. The method of claim 2, wherein the electrodes are present between adjacent portions of nanomaterial sections in the plurality of nanomaterial sections.

4. The method of claim 1, wherein forming said plurality of different thickness portions comprises:
   depositing the second transparent material layer having a uniform thickness;
   forming a material layer for a photoresist mask having a uniform thickness;
   patterning the material layer with different levels of radiation;
   developing the material layer treated with different levels of radiation to provide a stepped etch mask; and
   etching the second transparent material layer using the stepped etch mask.

5. The method of claim 1, wherein said etching comprises an anisotropic etch.

6. The method of claim 1, wherein each successive step of reducing thickness provides a dimension from the first mirror structure to the second mirror structure with one of the plurality of nanomaterial sections present therebetween that provides a wavelength to be measured by change in resistance measured across electrodes from said alternating sequence of electrodes that are positioned on opposing sides of said one of said plurality of nanomaterial sections.

7. A method of forming a wavelength detector comprising:
   forming a first transparent material layer having on a first mirror structure;
   forming an active element layer including a plurality of nanomaterial sections and electrodes in an alternating sequence atop the first transparent material layer;
   forming a second transparent material layer having a plurality of different thickness portions atop the active element layer, wherein the plurality of different thickness portions include a plurality of reducing thicknesses with successive steps, each step of reducing thickness overlying one of the plurality of nanomaterials; and
   forming a second mirror structure on the second transparent material layer.

8. The method of claim 7, wherein plurality of nanomaterial sections are composed of nanomaterials selected from the group consisting of graphene, transition metal dichalcogenides, carbon fullerenes, carbon nanotubes, black phosphorus or a combination thereof.

9. The method of claim 8, wherein forming the plurality of nanomaterial sections comprises:
   forming a layer of nanomaterials using a deposition process selected from the group consisting of chemical vapor deposition (CVD) or van der Walls epitaxial growth; and
   patterning the plurality of nanomaterial sections from the layer of nanomaterials using a photoresist mask and etch process.

10. The method of claim 8, wherein the second transparent material layer is composed of a light transmissive material selected from the group consisting of aluminum oxide (Al2O3), silicon oxide (SiO2), silicon (Si), silicon nitride (Si3N4) and combinations thereof.

11. The method of claim 10, wherein forming said plurality of different thickness portions comprises:
   depositing the second transparent material layer having a uniform thickness;
   forming a material layer for a photoresist mask having a uniform thickness;
   patterning the material layer with different levels of radiation;
   developing the material layer treated with different levels of radiation to provide a stepped etch mask; and etching the second transparent material layer using the stepped etch mask.

12. The method of claim 11, wherein said etching comprises an anisotropic etch.

13. The method of claim 12, wherein each successive step of reducing thickness provides a dimension from the first mirror structure to the second mirror structure with one of the plurality of nanomaterial sections present therebetween that provides a wavelength to be measured by change in resistance measured across electrodes from said alternating sequence of electrodes that are positioned on opposing sides of said one of said plurality of nanomaterial sections.

14. The method of claim 7, wherein the first transparent material layer has a uniform thickness.

* * * * *